United States Patent
Smith

(10) Patent No.: US 8,076,208 B2
(45) Date of Patent: Dec. 13, 2011

(54) METHOD FOR FORMING TRANSISTOR WITH HIGH BREAKDOWN VOLTAGE USING PITCH MULTIPLICATION TECHNIQUE

(75) Inventor: Mike Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 370 days.

(21) Appl. No.: 12/167,976

(22) Filed: Jul. 3, 2008

(65) Prior Publication Data

US 2010/0003797 A1 Jan. 7, 2010

(51) Int. Cl.
*H01L 21/336* (2006.01)
*H01L 21/331* (2006.01)
*H01L 21/311* (2006.01)
*G03F 1/00* (2006.01)
*H01L 21/70* (2006.01)

(52) U.S. Cl. ........ 438/296; 438/294; 438/353; 438/359; 438/702; 257/506; 430/5

(58) Field of Classification Search .................. None
See application file for complete search history.

(56) References Cited

U.S. PATENT DOCUMENTS

| | | |
|---|---|---|
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 5,013,680 A | 5/1991 | Lowrey et al. |

(Continued)

FOREIGN PATENT DOCUMENTS

DE 42 36 609 5/1994

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner* — N Drew Richards
*Assistant Examiner* — Michael Jung
(74) *Attorney, Agent, or Firm* — Knobbe, Martens, Olson & Bear LLP

(57) ABSTRACT

Transistors are formed using pitch multiplication. Each transistor includes a source region and a drain region connected by strips of active area material separated by shallow trench isolaton structures. The shallow trench isolaton structures are formed by dielectric material filling trenches that are formed by pitch multiplication. During pitch multiplication, rows of spaced-apart mandrels are formed and spacer material is blanket deposited over the mandrels. The spacer material is etched to define spacers on sidewalls of the mandrels and the mandrels are subsequently removed, thereby leaving freestanding spacers. The spacers constitute a mask, through which an underlying substrate is etched to form the trenches and strips of active area material. The trenches are filled to form the shallow trench isolaton structures. The substrate is doped to form source, drain and channel regions and a gate is formed over the channel region. In some embodiments, the shallow trench isolaton structures and the strips of material facilitate the formation of transistors having a high breakdown voltage.

28 Claims, 12 Drawing Sheets

U.S. PATENT DOCUMENTS

| | | |
|---|---|---|
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,773,998 B1 | 8/2004 | Fisher et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Cheng |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,442,976 B2 | 10/2008 | Juengling |
| 7,537,866 B2 * | 5/2009 | King Liu ............... 430/5 |
| 7,808,050 B2 * | 10/2010 | Sonsky et al. .......... 257/368 |
| 7,851,135 B2 | 12/2010 | Jung |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0167394 A1 | 8/2005 | liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0292991 A1 | 11/2008 | Wallow |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 57-048237 | 3/1982 |
| JP | 05343370 | 12/1993 |
| JP | H8-55908 | 2/1996 |
| JP | H8-55920 | 2/1996 |
| JP | 2004-152784 | 5/2004 |
| KR | 1999-0001440 | 1/1999 |

| | | |
|---|---|---|
| KR | 1999-027887 | 4/1999 |
| WO | WO 94/15261 | 7/1994 |
| WO | WO 02/099864 | 12/2002 |
| WO | WO 2004/001799 | 12/2003 |
| WO | WO 2004/003977 | 1/2004 |
| WO | WO 2005/034215 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Bruek, S.R.J., "Optical and interferometric lithography—Nanotechnology enablers," *Proceedings of the IEEE*, vol. 93, No. 10, Oct. 2005, pp. 1704-1721.

Choi et al., "Sublithographic nanofabrication technology for nanocatalysts and DNA chips," *J.Vac. Sci. Technol.*, pp. 2951-2955 (Nov./Dec. 2003).

Chung et al., "Pattern multiplication method and the uniformity of nanoscale multiple lines*," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

"U.S. Appl. No. 11/543,515; Filed Oct. 24, 2006, MICRON Ref. No. 2005-1173.00/US.".

Ex Parte Cantell, unpublished decision of the Board of Patent Appeals and Interferences, Mar. 4, 2005.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectic materials by high-density plasma etching," Solid State Tech., May 2000, 8 pages.

Sheats et al., "Microlithography: Science and Technology," *Marcel Dekkar, Inc.*, pp. 104-105 (1998).

U.S. Office Action of Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

* cited by examiner

METHOD FOR FORMING TRANSISTOR WITH HIGH BREAKDOWN VOLTAGE USING PITCH MULTIPLICATION TECHNIQUE

BACKGROUND OF THE INVENTION

1. Field of the Invention

This invention relates generally to semiconductor processing and, more particularly, to the fabrication of semiconductor devices, such as transistors.

2. Description of the Related Art

Transistors with high breakdown voltages are used in various applications, including for power management or amplification and for various driver systems. One approach for forming transistors with high breakdown voltage is to form the transistors in a thick and low-doped epitaxial layer. The low-doped epitaxial layer has a high resistivity, however, which can make integration with low voltage circuitry difficult.

The dielectric reduced surface field (DIELER) effect allows another approach for forming transistors with a high breakdown voltage. Devices formed to take advantage of the DIELER effect can have a shallow, elongated N-type region formed in an epitaxial layer, with a source and drain at opposite ends of the N-type region. Such devices possess a high breakdown voltage and have relatively low resistivity. However, different, e.g., even higher, breakdown voltage characteristics are desirable in some high voltage applications.

Accordingly, there is a continuing need for methods of forming semiconductor devices, such as transistors, with high breakdown voltage.

DETAILED DESCRIPTION

Figure 1A:
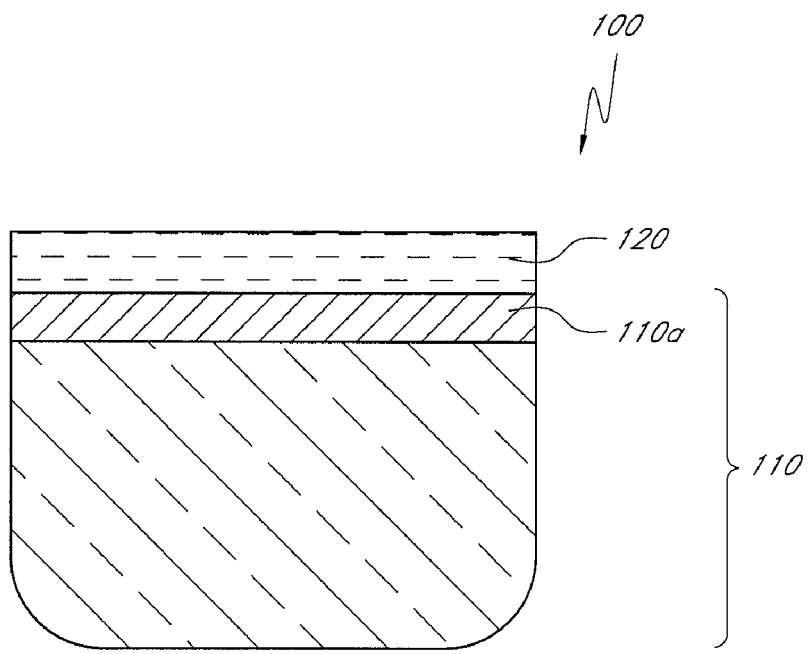
FIGS. 1A and 1B are schematic cross-sectional side and top views of a partially formed integrated circuit, in accordance with some embodiments of the invention.

Pitch multiplication is used to form transistors having strips of active area material that extend between and connecting source and drain regions of the transistors. The strips are separated from each other by isolation features, which are formed by dielectric material that fills trenches that are formed by pitch multiplication.

It will be appreciated that "pitch multiplication" can extend the capabilities of photolithographic techniques beyond their resolution limits. "Pitch" is defined as the distance between similar points in two neighboring features, such as features in an array, which are typically arranged in a repeating pattern. These features are typically defined by spaces between adjacent features, which spaces are typically filled by a material, such as a dielectric material. As a result, pitch may be viewed as the sum of the width of a feature and of the width of the space on one side of the feature separating that feature from a neighboring feature.

Photolithographic techniques typically have a minimum pitch below which they cannot reliably form features. Pitch multiplication allows the formation of features below this minimum pitch.

In pitch multiplication, spaced-apart, sacrificial mandrels are formed over a substrate. The mandrels are sacrificial features that are used as placeholders for spacer formation. Spacers are formed on sidewalls of the mandrels, which have a certain pitch. Spacer material is blanket deposited over the mandrels. The spacer material is etched to define spacers on sidewalls of the mandrels. The mandrels are then removed to leave free-standing spacers over the substrate. The resulting spacers have a pitch that is about half that of the mandrels. Thus, where a given pitch previously included a pattern defining one feature and one space, the same width now includes two features and two spaces.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

The free-standing spacers form a mask. The underlying substrate is etched through the mask to form trenches in the substrate. The trenches define and separate strips of material in an active area of the substrate.

The trenches are filled with dielectric material to form shallow trench isolaton (STI) structures. Source, drain and channel regions are formed, e.g., by doping the substrate before or after forming the shallow trench isolation structures, thereby forming a transistor. A gate is formed adjacent the channel region.

Advantageously, in some embodiments, the STI structures and the strips of material facilitate the formation of transistors having a high breakdown voltage. While the invention is not limited by theory, it is believed that the isolated strips of active area material decrease the peak electric-field at the edges of the junctions of the transistors, e.g., near the gate of a transistor, thereby increasing the breakdown voltage.

Advantageously, for a transistor of a given size, the incorporation of the STI structures can increase the breakdown voltage without altering the size of the transistor. Moreover, it will be appreciated that the pitch multiplication process can allow for the formation of sublithographically-sized features. For example, pitch multiplication can allow for the formation of narrower and/or a denser pattern of active area strips than possible by conventional photolithography processes. The narrower and/or a denser pattern of active area strips may further increase the breakdown voltage of transistors and/or may allow the application of the STI structures to transistors of very small dimensions.

Reference will now be made to the Figures, wherein like numerals refer to like or corresponding parts throughout. It will be appreciated that these Figures are not necessarily drawn to scale. Moreover, it will be appreciated that only a limited number of features, including a transistor and its associated structures, are illustrated for ease of discussion and illustration. Different numbers of and/or positions for these features can be provided in some embodiments.

In a first phase of some embodiments of the invention, trenches are formed by pitch multiplication.

Figure 1B:
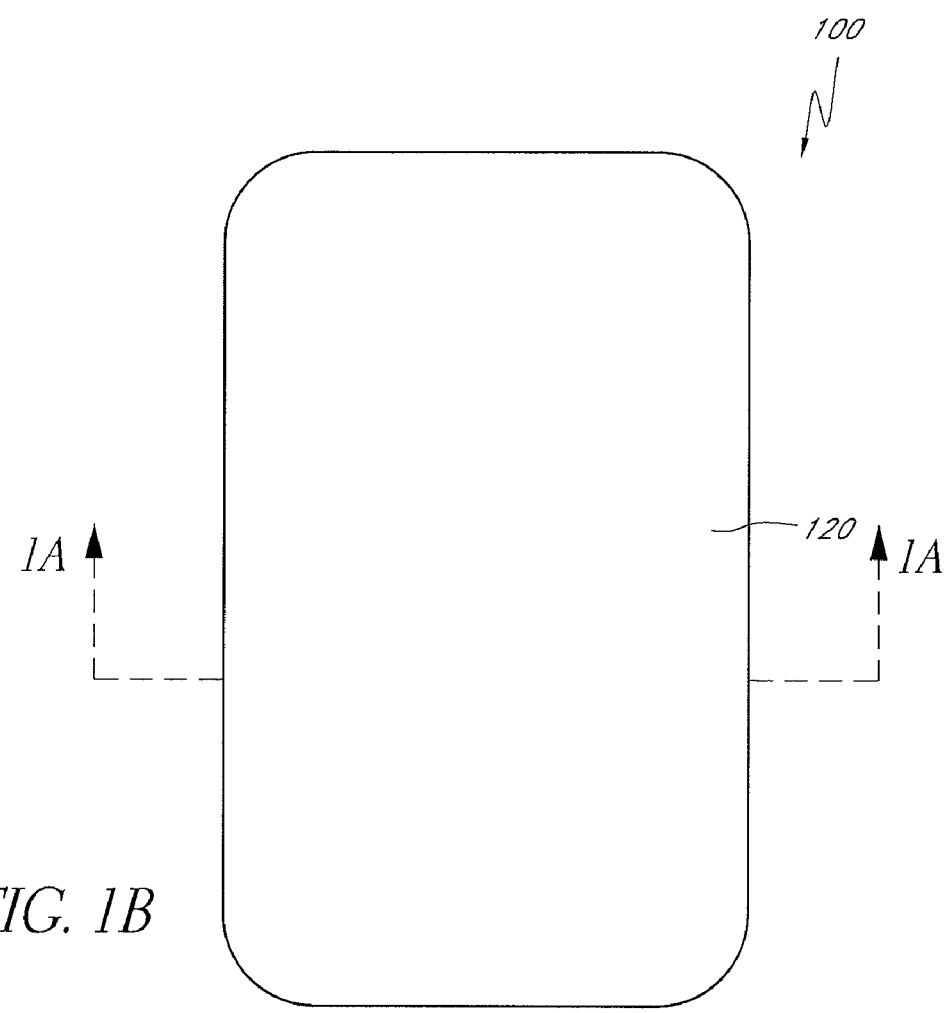

FIGS. 1A and 1B show cross-sectional side and top plan views of a portion of a partially fabricated integrated circuit 100. Embodiments of the invention may be applied to form devices in various substrates. In some embodiments, the integrated circuit 100, can be a volatile or non-volatile memory device such as DRAM, ROM or flash memory, including NAND or NOR flash memory.

With reference to FIG. 1A, a selectively definable layer 120 is provided overlying a substrate 110. The substrate 110 can include a dopant-containing semiconductive layer 110a, which can extend partly or completely across the substrate 110. In some embodiments, the layer 110a can be doped with N- or P-type dopants. In the illustrated embodiment, the layer 110a is doped with N-type dopant (e.g., the layer 110a can be an silicon epitaxial layer doped with N-type dopant) and the layer 110 is doped with a P-type dopant.

With continued reference to FIGS. 1A and 1B, the selectively definable layer 120 is photodefinable in some embodiments, e.g., formed of a photoresist, including any photoresist known in the art, e.g., including any positive or negative photoresist. For example, the photoresist may be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm wavelength light. KrF photoresists are used with longer wavelength photolithography systems, such as 248 nm systems. In other embodiments, the layer 120 and any subsequent resist layers may be formed of a resist that may be patterned by nanoimprint lithography, e.g., by using a mold or mechanical force to pattern the resist. In addition, maskless lithography, or maskless photolithography, may be used to define the selectively definable layer 120.

Figure 2A:
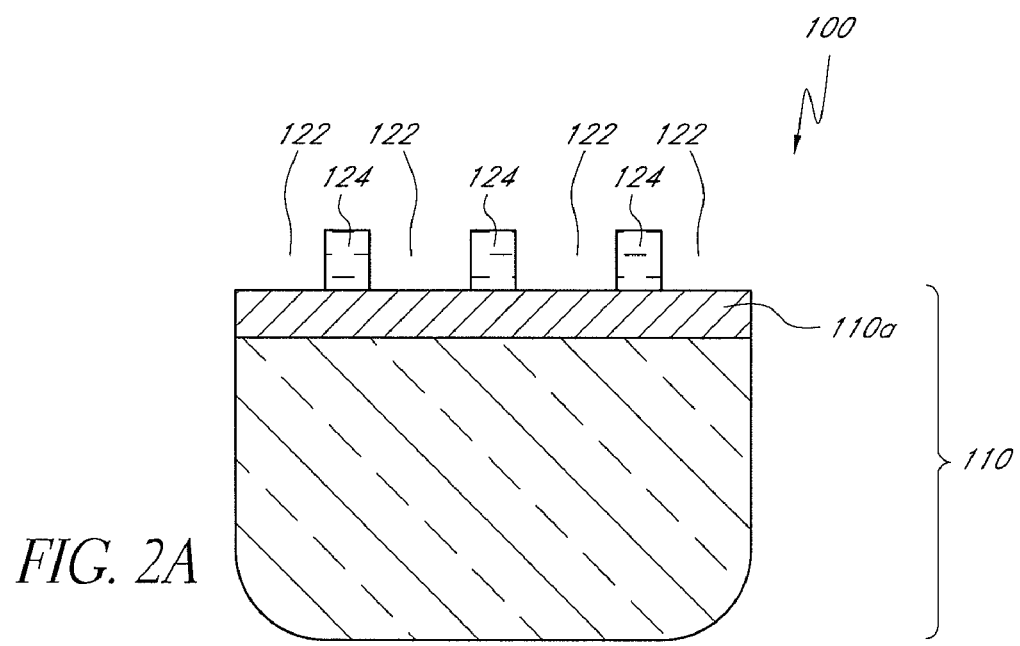
FIGS. 2A and 2B are schematic cross-sectional side and top plan views of the partially formed integrated circuit of FIGS. 1A and 1B after forming mandrels in a photoresist layer, in accordance with some embodiments of the invention.
Figure 2B:
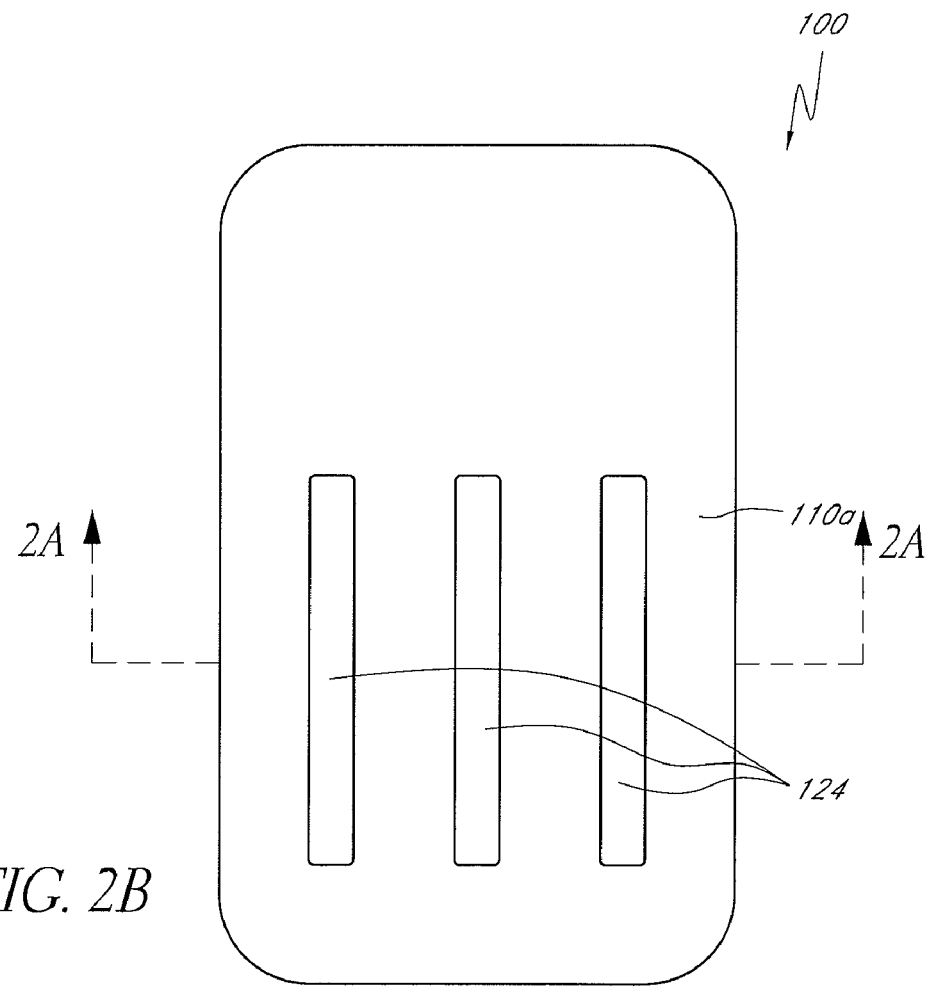

With reference to FIGS. 2A and 2B, a pattern comprising space 122 is formed in the photodefinable layer 120. The spaces 122 are delimited by photodefinable material features 124. The spaces 122 may be formed by, e.g., photolithography with 248 nm or 193 nm light, in which the layer 120 is exposed to radiation through a reticle and then developed. After being developed, the remaining photodefinable material, photoresist in the illustrated embodiment, forms the illustrated features 124. The pitch of the resulting features 124 is equal to the sum of the width of a feature 124 and the width of a neighboring space 122. In the illustrated embodiment, the features 124 define mandrels for later spacer formation.

Figure 3:
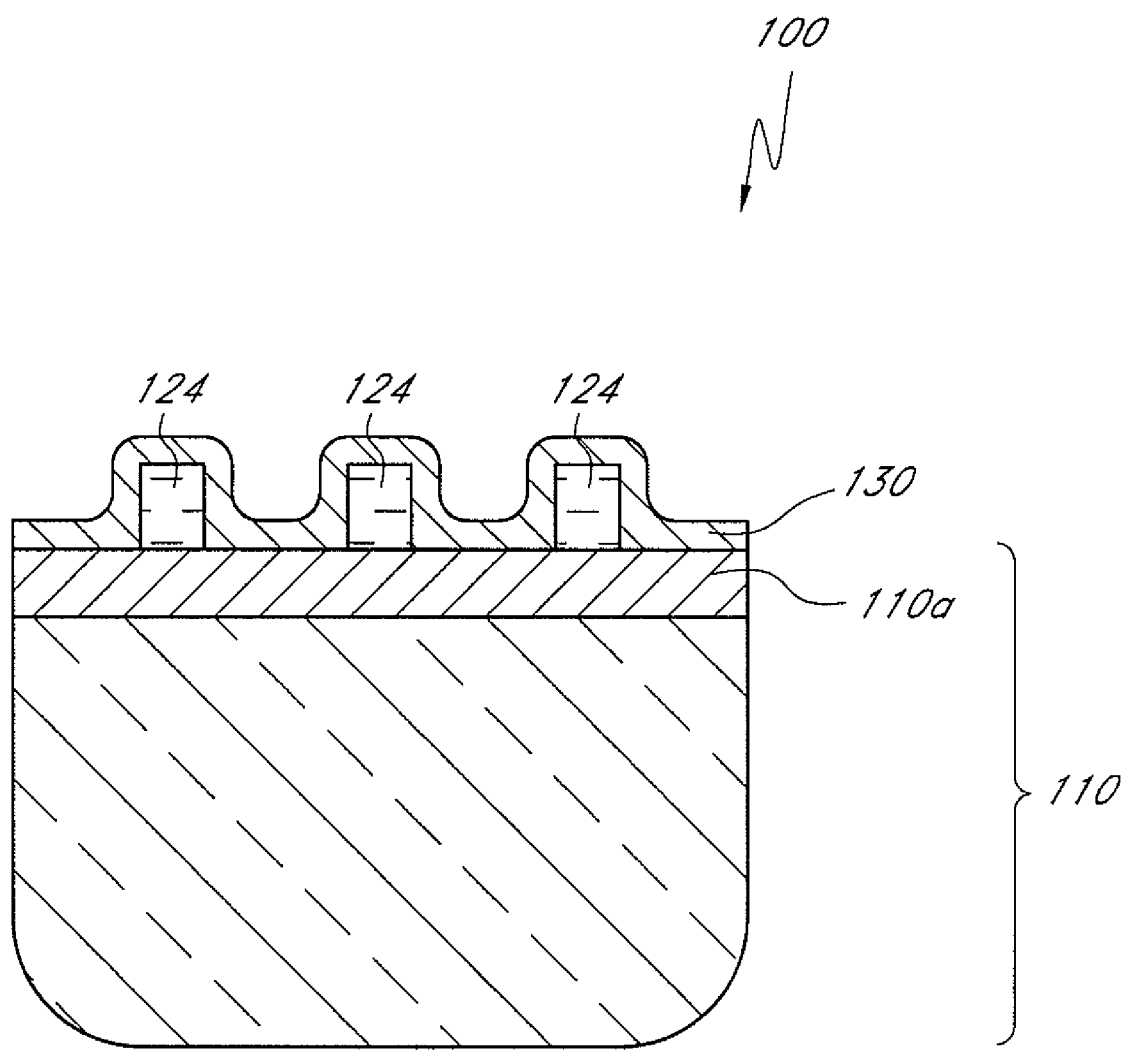
FIG. 3 is a schematic cross-sectional side view of the partially formed integrated circuit of FIGS. 2A and 2B after depositing a layer of a spacer material, in accordance with some embodiments of the invention.

With reference to FIG. 3, a layer 130 of spacer material is blanket deposited conformally over exposed surfaces, including the doped layer 110a and the top and sidewalls of the mandrels 124. The spacer material is chosen to be a material that can act as a mask for transferring a pattern to the underlying doped layer 110a. Examples of spacer materials can include, without limitation, silicon oxide and silicon nitride. The spacer material is chosen for compatibility with other materials in the integrated circuit 100, including etch selectivity to underlying materials. In the illustrated embodiment, the spacer material is silicon oxide, which provides particular advantages in combination with other selected materials of the masking stack.

Methods for spacer material deposition include atomic layer deposition, e.g., using a self-limiting deposition with a silicon precursor and a subsequent exposure to an oxygen or nitrogen precursor to form silicon oxides and nitrides, respectively. In some embodiments, to form silicon oxide, a silicon halide, such as silicon hexachlorodisilane (HCD), is introduced in pulses alternating with pulses of an oxygen precursor, such as $H_2O$. ALD can be performed at relatively low temperatures, e.g., under about 200° C. or under about 100° C., which has advantages for preventing thermal damage to underlying carbon-based materials, such as the photoresist mandrels 124. In addition, films deposited by ALD exhibit excellent uniformity and conformality, which has advantages for forming highly uniform mask features. In some embodiments, the step coverage is about 80% or greater and or about 90% or greater.

The thickness of the layer 170 is determined based upon the desired width of the spacers to be formed. For example, in some embodiments, the layer 170 is deposited to a thickness of about 100-10 nm or about 50-20 nm to form spacers of roughly similar widths.

Figure 4A:
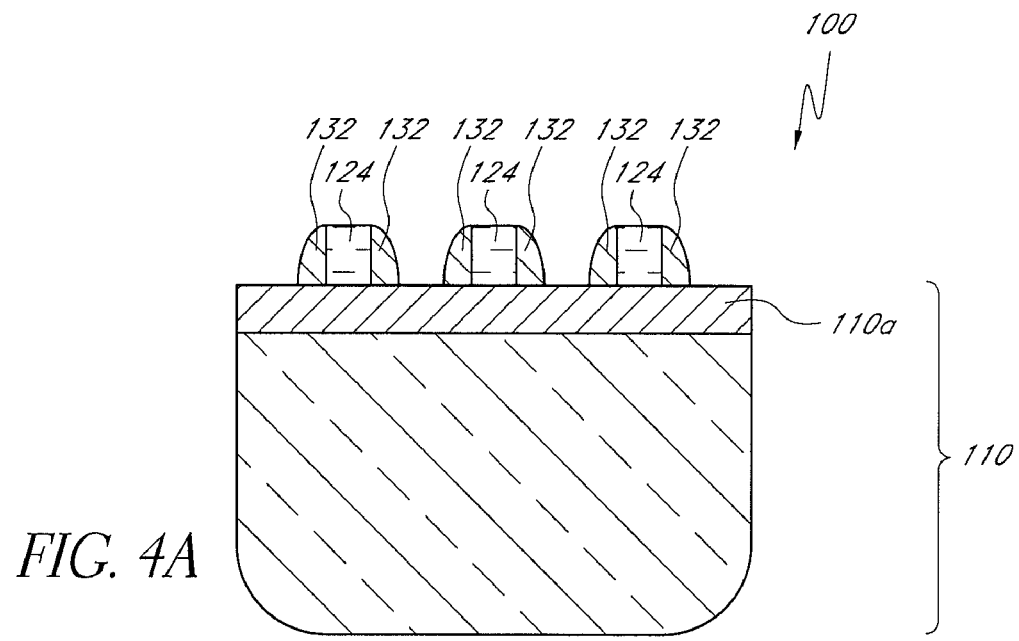
FIGS. 4A and 4B are schematic, cross-sectional side and top plan views of the partially formed integrated circuit of FIG. 3 after etching the spacer material to form spacers, in accordance with some embodiments of the invention.
Figure 4B:
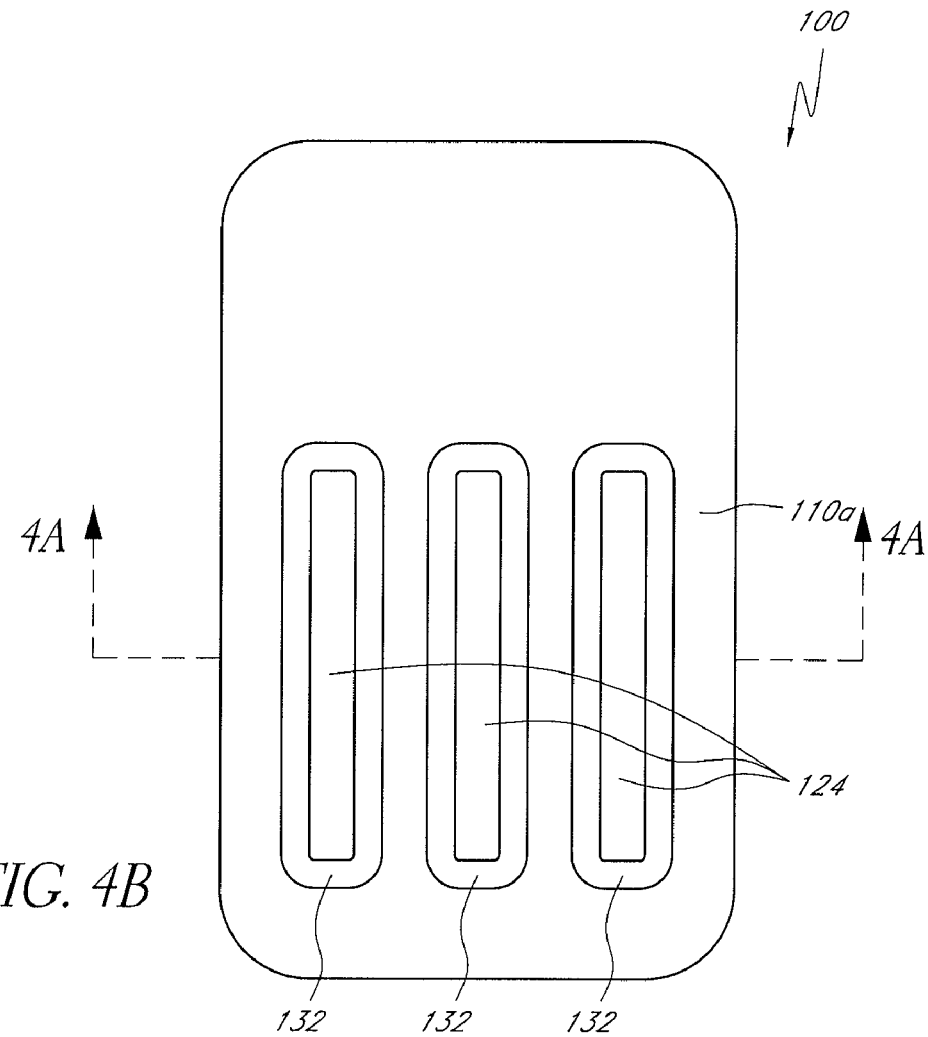

With reference to FIGS. 4A and 4B, the silicon oxide spacer layer 170 is subjected to an anisotropic etch to preferentially remove spacer material from horizontal surfaces of the partially formed integrated circuit 100. Thus, spacers 132 are defined on sidewalls of the mandrels 124.

Figure 5A:
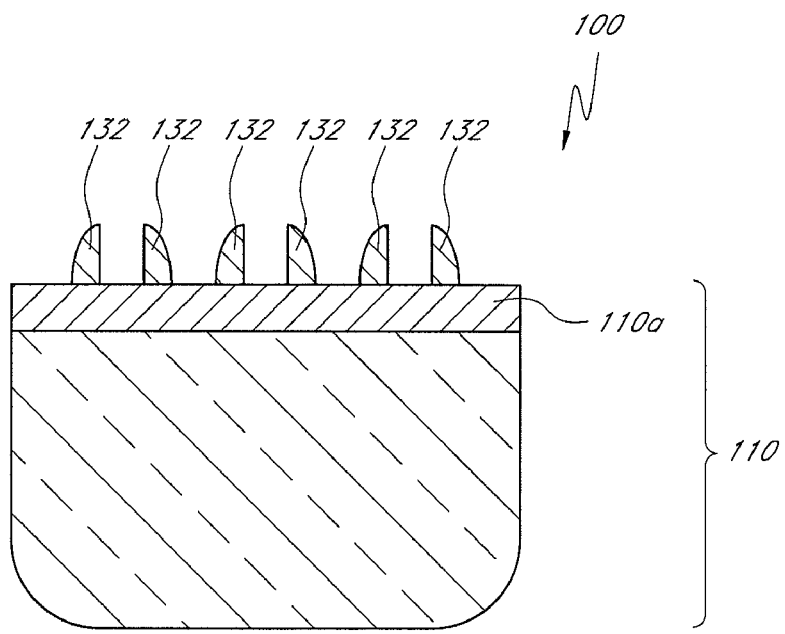
FIGS. 5A and 5B are schematic, cross-sectional side and top plan views of the partially formed integrated circuit of FIGS. 4A and 4B after selectively removing mandrels, in accordance with some embodiments of the invention.
Figure 5B:
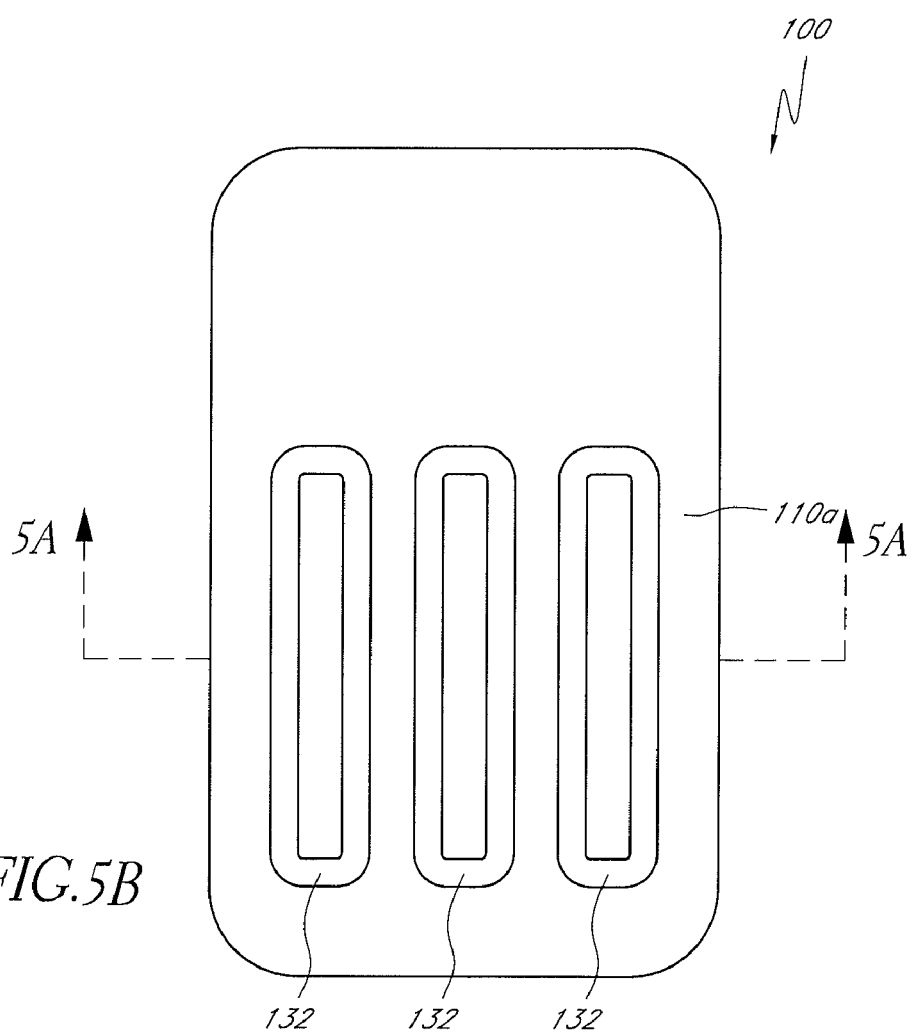

With reference to FIGS. 5A and 5B, the mandrels 124 are selectively removed to leave freestanding spacers 132. The selectively definable layer 120 may be selectively removed using an organic strip process or various other etching processes. An etch is "selective" to a material if the etch removes that material without removing a substantial amount of other material(s) exposed to the etch. In some embodiments, the etch rate for a selectively etched material is at least about 5 times greater, or at least about 10 times greater, or at least about 20 times greater than that for surrounding materials.

Thus, pitch-multiplied spacers 132 have been formed. The pitch of the spacers 132 is roughly half that of the mandrels 124 and spaces 122 (FIGS. 2A and 2B) originally formed by photolithography. It will be appreciated that because the spacers 132 are formed on the sidewalls of mandrels 124, the spacers 132 form closed loops around the mandrels 124. In the illustrated embodiment, the spacers 132 form elongated loops and have substantially parallel legs that are joined at their ends.

In some embodiments, the loop ends are not transferred to the substrate 110 when forming trenches in the substrate 110. To prevent this transfer, in some embodiments, the loop ends can be removed, e.g., by depositing a protective material over the spacers 132, patterning the protective material to expose the ends of spacer loops while protecting the central portions of the loops, and then etching the loop ends. The protective material can then be removed and the remaining portions of the spacers 132 used as a mask for etching the substrate 110.

Figure 6A:
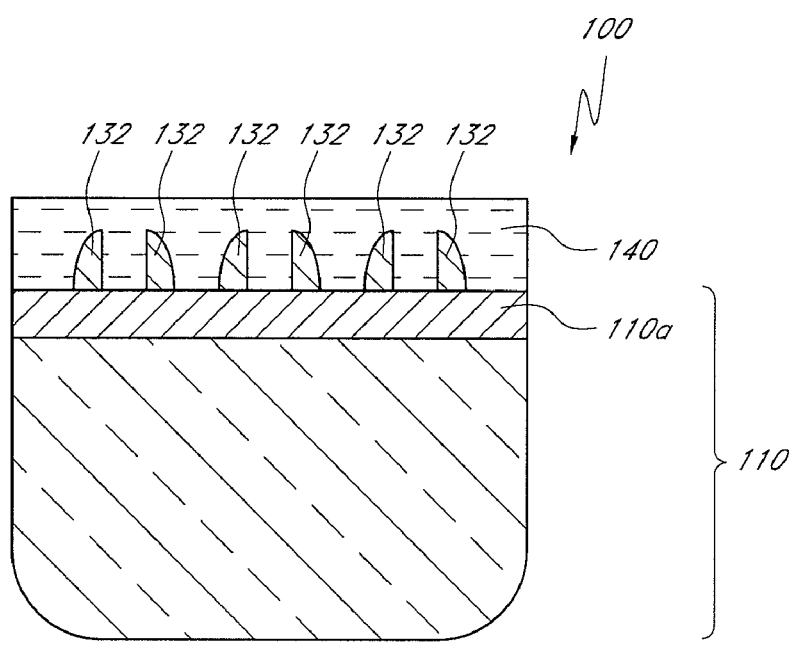
FIGS. 6A and 6B are schematic, cross-sectional side and top plan views of the partially formed integrated circuit of FIGS. 5A and 5B after depositing a protective material between and over the spacers, in accordance with some embodiments of the invention.
Figure 6B:
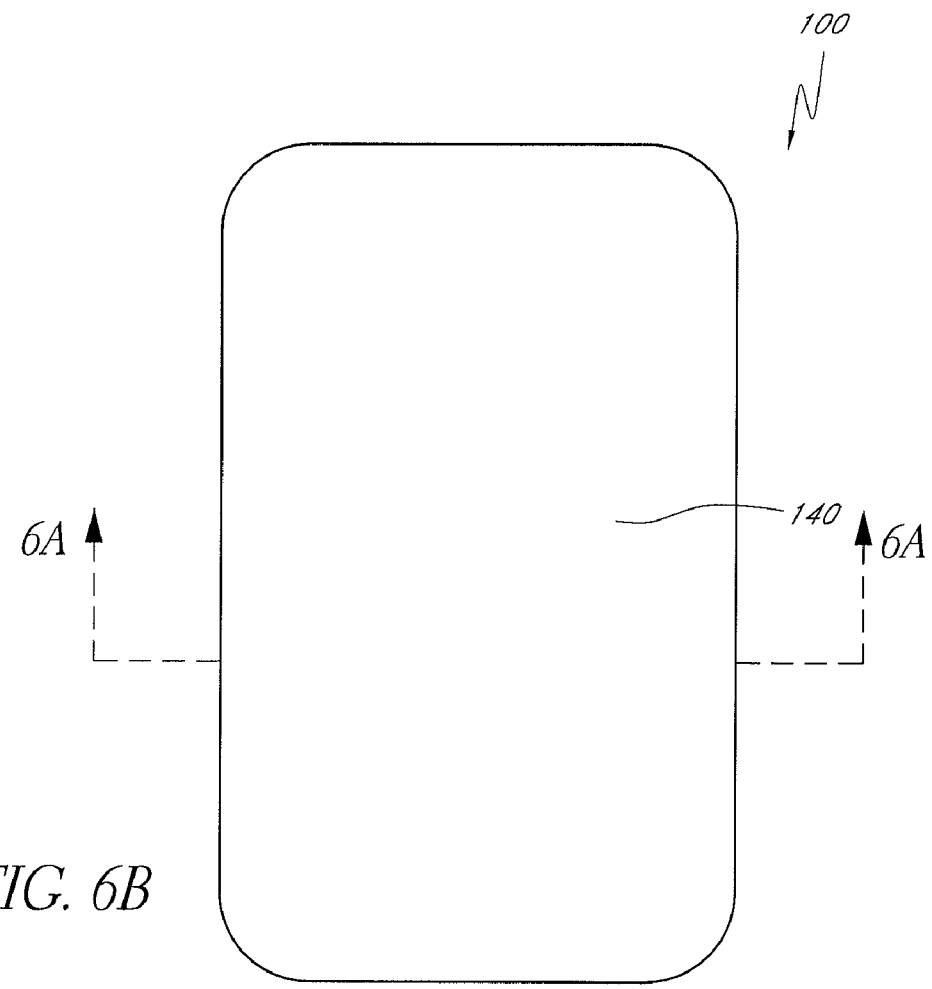

In some other embodiments, a protective material is deposited and the ends of the loops are covered to prevent transferring those ends to the substrate 110. With reference to FIGS. 6A and 6B, a protective layer 140 of selectively definable material is deposited around and over the spacers 140. The protective material can be, e.g., photoresist, which can be advantageous because it can be directly patterned by photolithography.

Figure 7A:
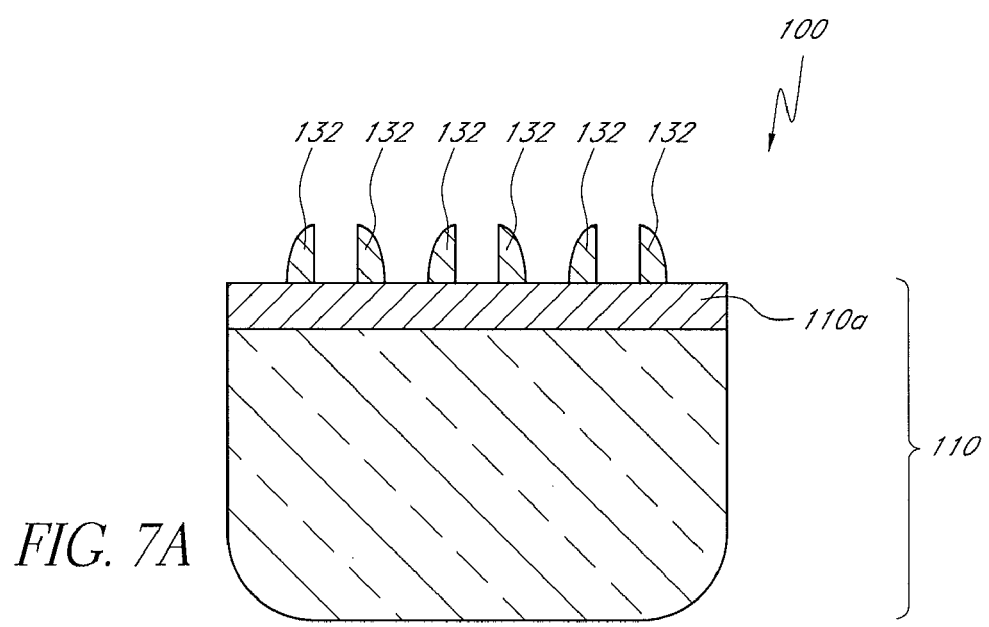
FIGS. 7A and 7B are schematic, cross-sectional side and top plan views of the partially formed integrated circuit of FIGS. 6A and 6B after patterning the protective material, in accordance with some embodiments of the invention.
Figure 7B:
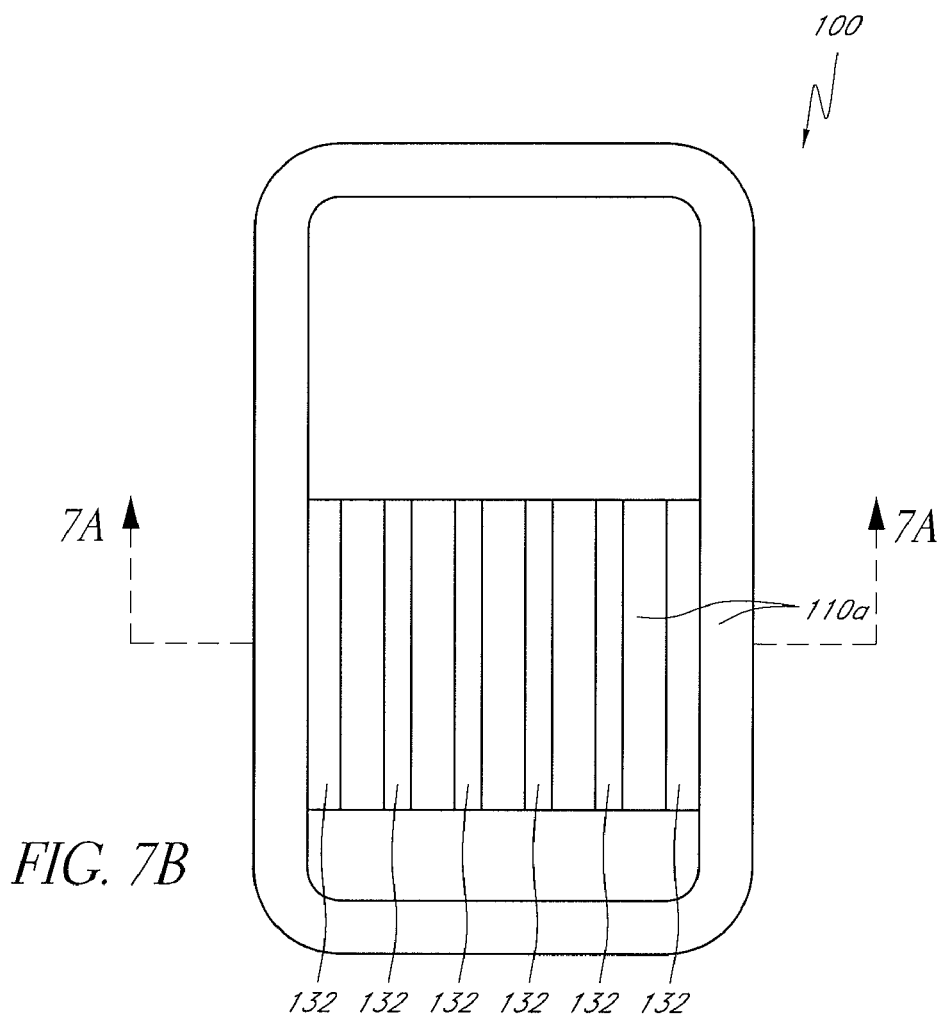

With reference to FIGS. 7A and 7B, the protective layer 140 is patterned. In embodiments in which the protective layer 140 is formed of photoresist, photolithography is performed. After exposing the protective layer 140 to radiation and performing a subsequent development, the central portions of the spacers 132 are left exposed, while the loop ends remain covered by protective material. In addition, the protective layer 140 can be patterned to form various other features in other regions of the partially-fabricated integrated circuit 100. For example, where the partially-fabricated integrated circuit 100 is a memory device, the protective layer 140 can also be patterned to form features in the periphery of the memory device.

Figure 8:
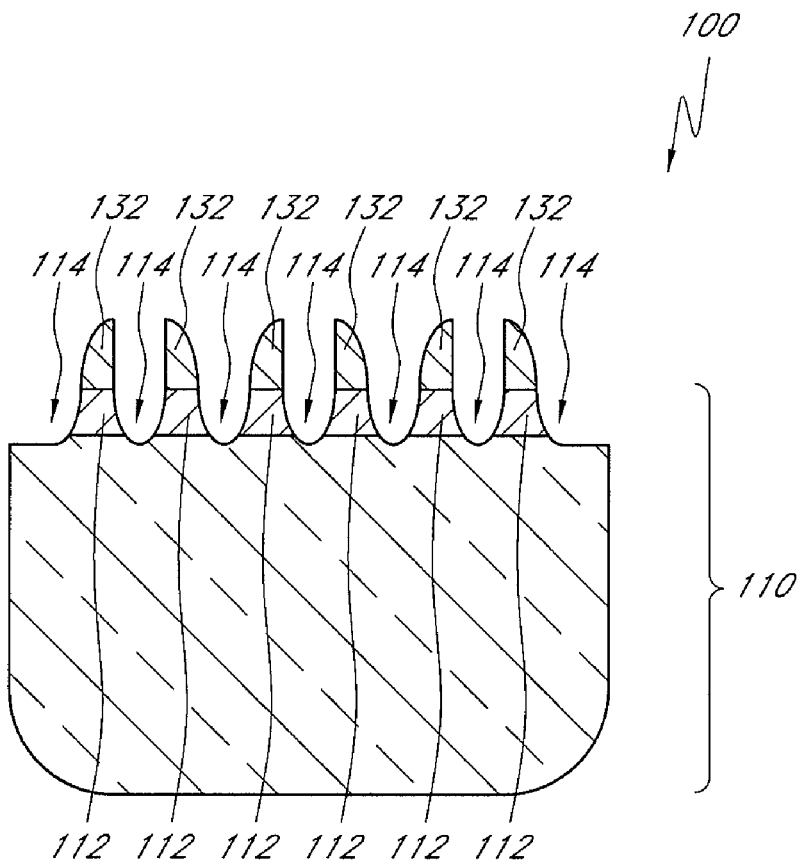
FIG. 8 is a schematic, cross-sectional side view of the partially formed integrated circuit of FIGS. 7A and 7B after etching the substrate, in accordance with some embodiments of the invention.

With reference to FIG. 8, the substrate 100 is selectively etched through the mask defined by the spacers 132 and the protective layer 140 (FIG. 7B), thereby defining the trenches 114. In some embodiments, the etch used to form the trenches 114 is a self-limiting etch, which can have advantages for automatically forming trenches of different sizes in different parts of the partially fabricated integrated circuit 100. For example, the narrow spacing of the spacers 132 can lead to the formation of smaller and/or shallower trenches than in other parts of the partially fabricated integrated circuit 100. A suitable self-limiting etch is disclosed in U.S. Patent Application Publication No. 2007/0194402 A1 to Sandhu et al. In some embodiments, as illustrated, the trenches 114 are formed extending completely through the doped layer 100a. The trenches 114 define active area strips 112.

Figure 9A:
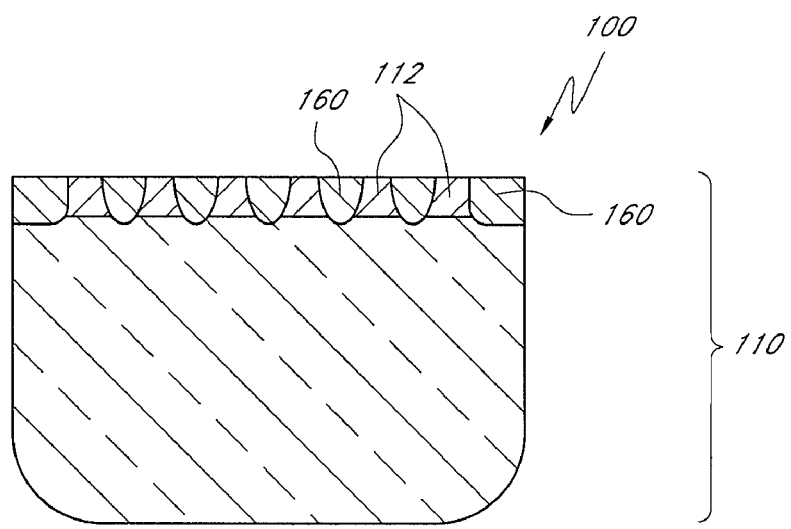
FIGS. 9A and 9B are schematic, cross-sectional side and top plan views of the partially formed integrated circuit of FIG. 8 after forming shallow trench isolation structures, in accordance with some embodiments of the invention.
Figure 9B:
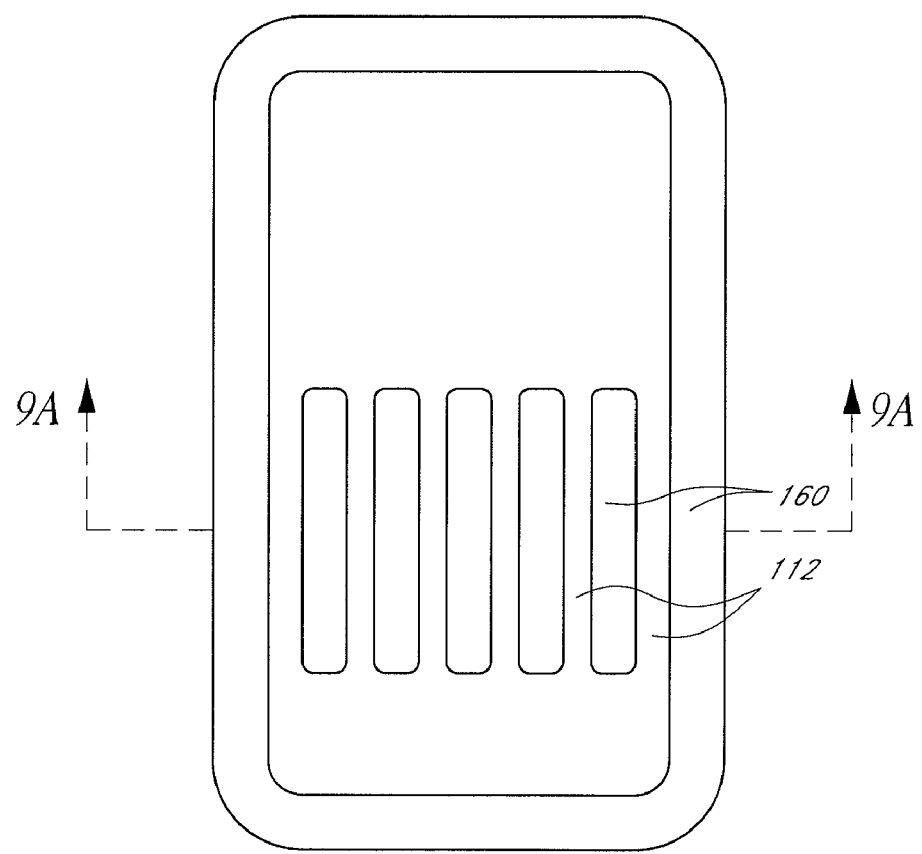

With reference to FIGS. 9A and 9B, the spacers 132 are removed and the trenches 114 are filled with a dielectric material to form shallow trench isolation (STI) structures 160. The dielectric material can be various dielectric materials know in the art, including, e.g., silicon oxide. In some embodiments, the silicon oxide is deposited to overfill the trenches 114 and excess silicon oxide is removed and the top surface of the partially fabricated integrated circuit 100 is planarized, e.g., by chemical mechanical polishing (CMP). Active area strips 112 separated by STI features 160 are left remaining.

Figure 10:
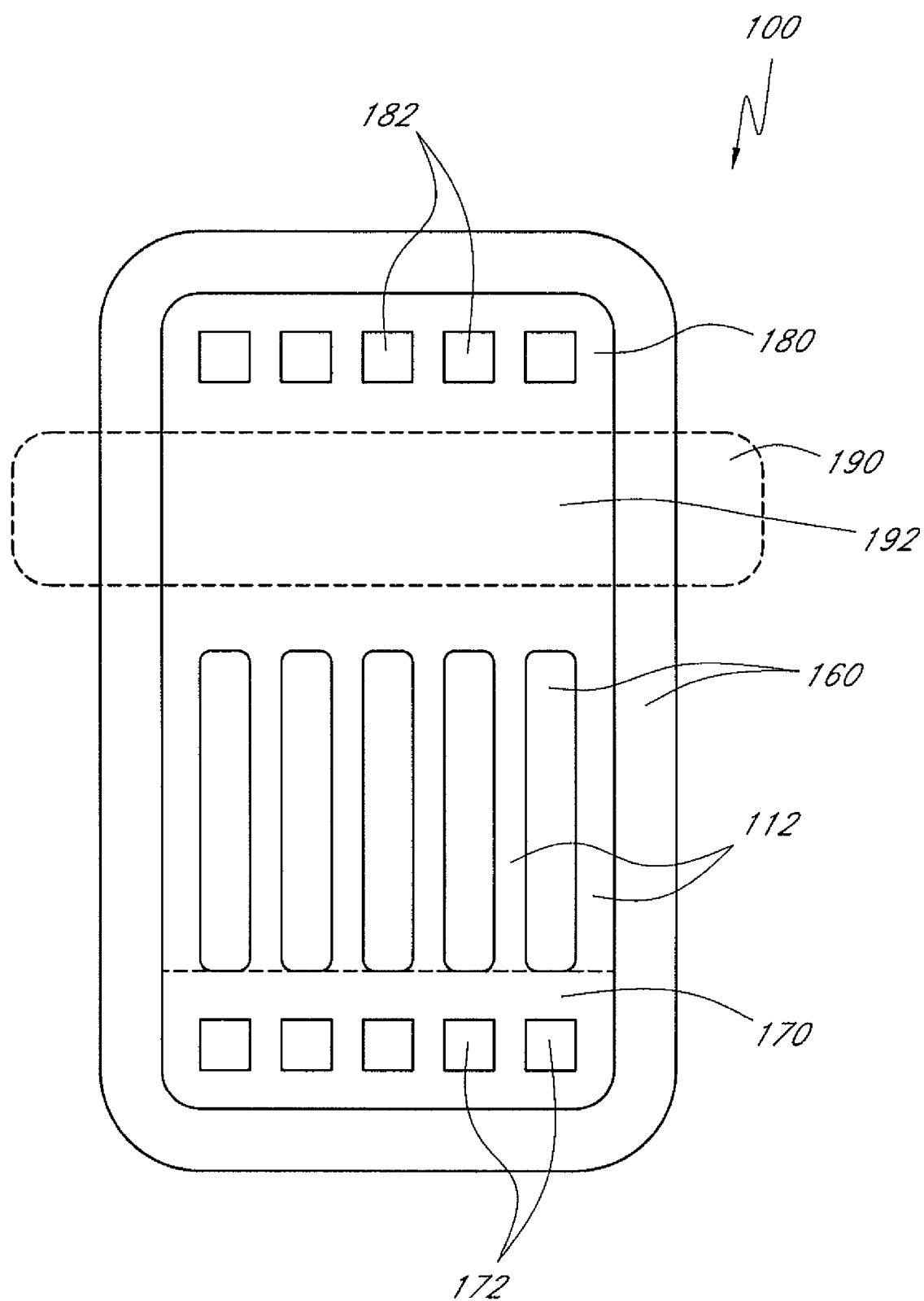
FIG. 10 is a schematic, top plan view of the partially formed integrated circuit of FIGS. 9A and 9B after forming a source, drain and gate, in accordance with some embodiments of the invention.

With reference to FIG. 10, a drain 170, source 180, and gate 190 are subsequently formed. The drain 170, source 180, and gate 190 can be formed by methods known in the art. In some embodiments, the drain regions 170 and source regions 180 are formed by doping to create n+ regions. The region underlying the gate 190 can be doped opposite to the drain and source regions 170, 180, to form, e.g., a P-type region 192. The gate 190 can then be formed over the P-type region 192. Drain contacts 172 and source contacts 182 can contact the drain region 170 and source region 180, respectively, to electrically connect those regions to other electronic devices in the partially-fabricated integrated circuit 100. In some embodiments, the drain region 170 and the source region 180 can extend the entire width of the illustrated transistor, or, in some other embodiments, the drain and source regions 170, 180 can be a plurality of separated regions localized under the drain contacts 172 and source contacts 182.

The various doped regions 170, 180 and 192 can be formed by methods known in the art. For example, the n+ regions can be created by forming a mask over the substrate 110, the mask being patterned to expose the parts of the substrate 110 corresponding to the n+ regions, and then supplying N-type dopant to those exposed regions. It will be appreciated that the exposed regions for N-type doping can correspond to the locations of the drain contacts 172 and source contacts 182. Similarly, P-type regions can be created by forming a mask over the substrate 110, the mask exposing the parts of the substrate 110 corresponding to the P-type regions, and then supplying P-type dopant to those exposed regions. The exposed regions for P-type doping can correspond to the location of channel regions underlying the gate 190.

Figure 11:
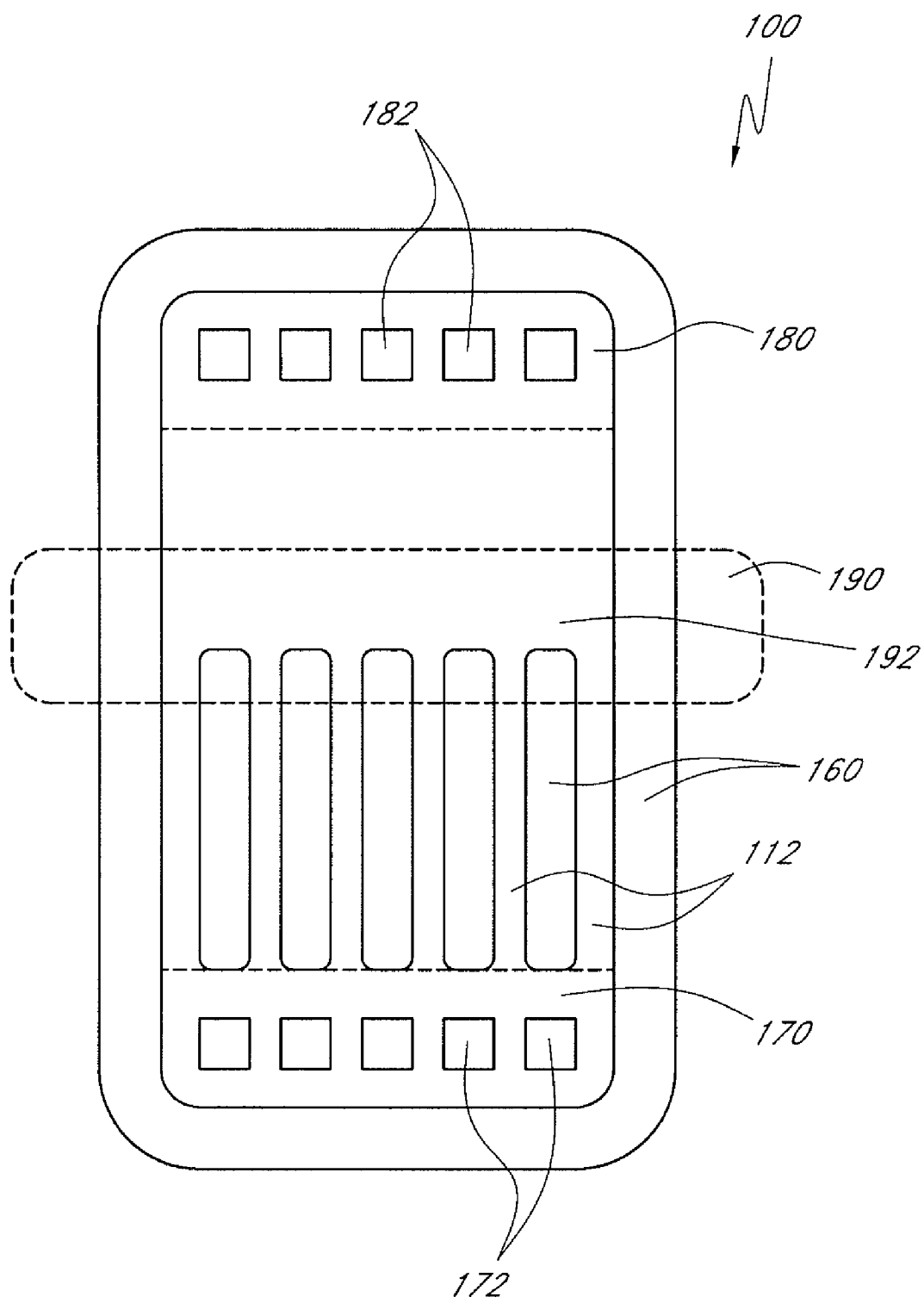
FIG. 11 is a schematic, top plan view of the partially formed integrated circuit of FIGS. 9A and 9B after forming a source, drain and gate, in accordance with some other embodiments of the invention.

It will be appreciated that the gate 190 and doped region 192 can be disposed at various locations between the drain 170 and the source 180. For example, with continued reference to FIG. 10, the gate 190 and doped region 192 are formed beyond the end of the STI structures 160 separating the active area strips 112. With reference to FIG. 11, in some other embodiments, the gate 190 formed partly or completely overlapping the STI structures 160 and active area strips 112, so that doped region 192 is disposed partly or completely in the active area strips 112.

While shown extending across the width of the illustrated transistor, in some embodiments, it will be appreciated that the drain region 170 and/or the source region 180 can only extend partly across the width of the transistor. In some other embodiments, the drain region 170 and/or the source region 180 can be formed of a plurality of separated regions (e.g., separated n+ regions). For example, with reference to FIG. 12, the drain region 170 can include a plurality of regions 170 at the ends of the active area strips 112. The regions 170 can each be n+ regions and a contact 172 can be made to each region 170. In addition, as noted herein, the gate 190 and doped region 192 can be disposed at various locations between the drain and source regions 170, 180. For example, as illustrated, the gate 190 and doped region 192 can be disposed beyond the end of the active area strips 112. In other embodiments, the gate 190 and the doped region 192 can overlap the active area strips 112 and the STI structures 160 separating the strips 112.

Figure 12:
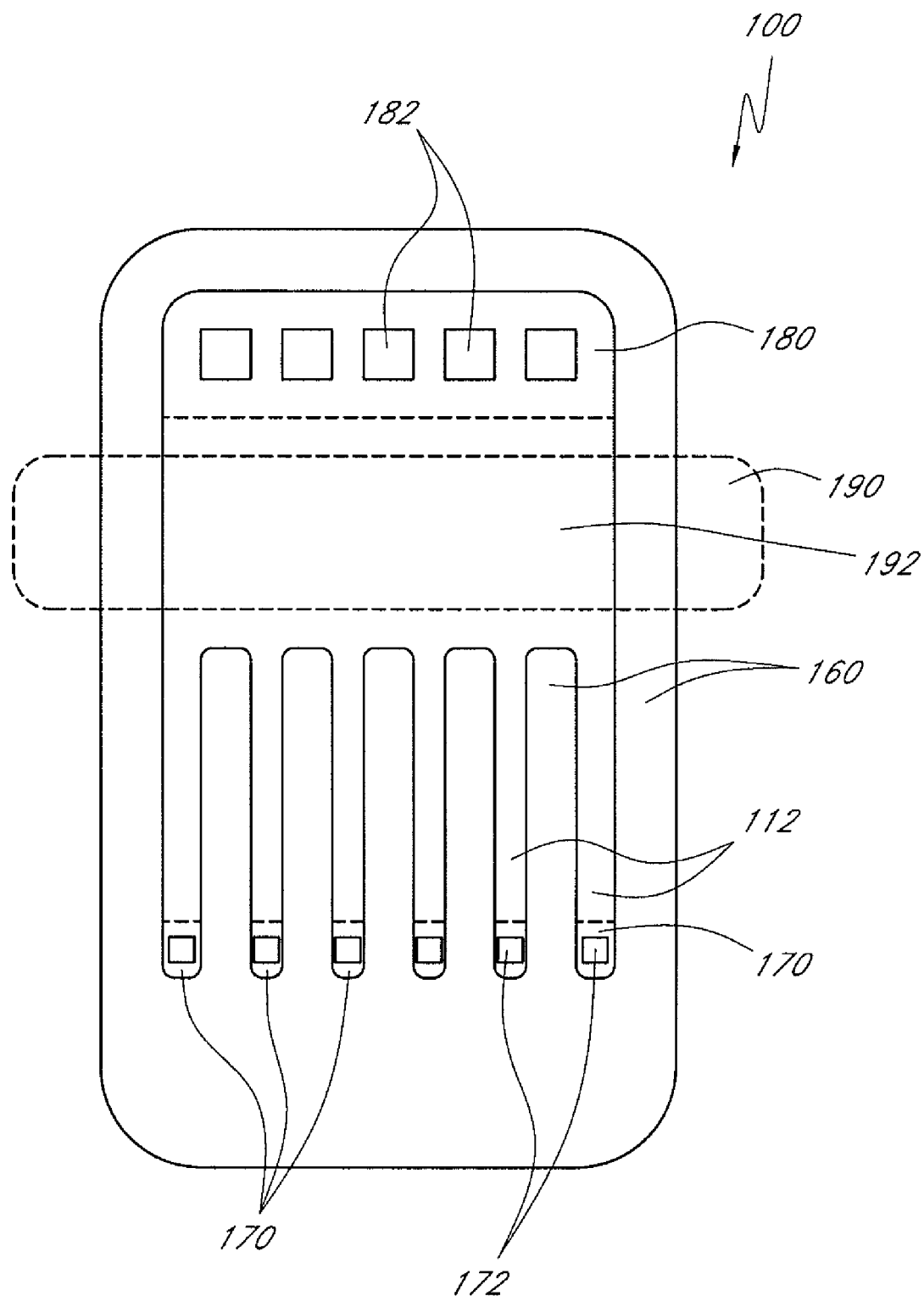
FIG. 12 is a schematic, top plan view of the partially formed integrated circuit of FIGS. 9A and 9B after forming a source, drain and gate, in accordance with yet other embodiments of the invention.

With reference to FIGS. 10-12, it will be appreciated that the active area strips 112 for drain extension regions that extend the drain region 170 away from the source region 180. In other embodiments, the region 170 can correspond to a source region and the region 180 can correspond to a drain region.

Thus, it will be appreciated that various modifications of the illustrated embodiment are contemplated. For example, as discussed herein, the active area strips are laterally separated and can extend parallel to one another. In some embodiments, the active area strips extend in a straight line and are regularly spaced apart. In some other embodiments, the strips can curve or some parts of the strips can extend at an angle to some other parts of the strips, or the separation between strips can vary as desired.

In addition, in some embodiments, the widths of the STI structures and active area strips are approximately equal, with a ratio of STI structure width to active area strip width equal to about 1:1. In other embodiments, the ratio is greater than 1:1 or less than 1:1. It will be appreciated that ratios about 1:1 or higher allow for relatively higher breakdown voltage, while ratios lower than 1:1 forms a transistor with a relatively lower breakdown voltage. Advantageously, selection of the ratio of STI structure width to active area strip width allows the breakdown voltage of the transistor to be tailored.

Moreover, in some other embodiments, the pattern defined by the features 124 (FIG. 2A) can be transferred to one or more underlying levels of material to form mandrels in those levels, rather than the on level of the selectively definable material 120 (FIG. 1A). In addition, in some embodiments, the spaces 122 (FIG. 2A) can be widened by etching the photoresist features 124 using an isotropic etch to "shrink" or trim those features. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The width-reducing etch trims the features 124 so that they are narrower than would otherwise be possible using the photolithographic technique used to pattern the photodefinable layer 120.

In addition, the pitch of spacers can be multiplied by a factor greater than two, relative to the pitch of the mandrels. For example, after removing the mandrels 124 (FIG. 4A), the spacers 132 can be used as mandrels and additional spacers can be formed on the spacers 132 by blanket depositing spacer material and anisotropically etching the blanket deposited spacer material.

It will be appreciated from the description herein that the invention includes various aspects. For example, according to one aspect of the invention, a method for forming a transistor is provided. The method comprises providing a plurality of mandrels overlying a semiconductor substrate. A layer of spacer material is blanket depositing on the mandrels. The spacer material is selectively etched to form spacers on sidewalls of the mandrel. A spacer mask is forming overlying the substrate by selectively removing the mandrels to leave a plurality of spacers. The substrate is etched through the spacer mask to define a plurality of trenches in the substrate. The trenches are defined between strips of semiconductor material. The trenches are filled with an dielectric material. A source for the transistor is provided proximate an end of the trenches. A drain for the transistor is provided proximate an opposite end of the trenches, the strips of semiconductor material extending between the drain and the source. A gate is provided overlying a channel region between the source and the drain.

According to another aspect of the invention, a method for integration circuit fabrication is provided. The method comprises providing a plurality of elongated loops of masking material over the substrate, the loops having loop ends and central portions disposed between the loop ends. A pattern defined by the central portions is transferred to the substrate to form a plurality of trenches in the substrate. The trenches separate strips of material in the substrate to define a transistor extension region in the substrate. A transistor source region is formed contiguous with the transistor drain extension region. A transistor drain region is formed contiguous with the transistor drain extension region.

According to yet another aspect of the invention, a method for fabricating a transistor is provided. The method comprises photolithographically defining a plurality of spaced-apart photoresist rows in a photoresist layer. A mask pattern is derived from the photoresist rows, the mask pattern comprising rows of mask material having a pitch two times or more a pitch of the photoresist rows. The mask pattern is transferred to an underlying substrate, thereby defining a plurality of spaced apart rows in the substrate. A transistor source region is provided contiguous with one end of the rows in the substrate. A transistor drain region is provided contiguous with an other end of the rows in the substrate.

While various embodiments of the invention the have been described herein, it will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. A method for forming a transistor, comprising:
   providing a plurality of mandrels overlying a semiconductor substrate;
   blanket depositing a layer of spacer material on the mandrels;
   selectively etching the spacer material to form spacers on sidewalls of the mandrels;
   forming a spacer mask overlying the substrate by selectively removing the mandrels to leave a plurality of spacers, the spacers formed of elongated loops of spacer material;
   etching the substrate through the spacer mask to define a plurality of trenches in the substrate, the trenches defined between strips of semiconductor material, wherein etching the substrate comprises:
      providing a protective mask material over ends of the loops; and
      transferring a pattern formed by exposed portions of the loops to the substrate while the protective mask material simultaneously prevents transfer of a shape defined by the ends of the loop to the substrate;
   filling the trenches with an dielectric material;
   providing a source for the transistor proximate an end of the trenches;
   providing a drain for the transistor proximate an opposite end of the trenches, the strips of semiconductor material extending between the drain and the source; and
   providing a gate overlying a channel region between the source and the drain.

2. The method of claim 1, wherein providing the plurality of mandrels comprises defining a pattern in a photoresist layer.

3. The method of claim 2, wherein the mandrels comprise photoresist.

4. The method of claim 2, further comprising transferring the pattern in the photoresist to a sacrificial layer formed of sacrificial material, wherein the mandrels are formed of the sacrificial material.

5. The method of claim 1, wherein providing the gate comprises forming a gate at least partially overlapping the plurality of trenches.

6. The method of claim 1, wherein providing the source comprises doping the substrate to form an N-doped region after etching the substrate.

7. The method of claim 6, wherein providing the drain comprises doping the substrate to form an N-doped region after etching the substrate.

8. The method of claim 7, wherein the strips of semiconductor material are formed of N-doped silicon.

9. The method of claim 8, wherein the channel region is a P-type region formed by doping the substrate to form the P-type region after etching the substrate.

10. A method for integration circuit fabrication, comprising:
- providing a plurality of elongated loops of masking material over the substrate, the loops having loop ends and central portions disposed between the loop ends;
- providing a protective mask material over the loop ends;
- transferring a pattern defined by exposed central portions to the substrate to form a plurality of trenches in the substrate, wherein the trenches separate strips of material in the substrate to define a transistor extension region in the substrate;
- blocking transfer of a shape defined by the loop ends to the substrate while transferring the pattern defined by exposed central portions;
- forming a transistor source region contiguous with the transistor extension region; and
- forming a transistor drain region contiguous with the transistor extension region.

11. The method of claim 10, further comprising selectively etching the loop ends before transferring the pattern defined by the central portions to the substrate.

12. The method of claim 10, wherein the plurality of elongated loops is formed of silicon oxide.

13. The method of claim 10, wherein the transistor source region, the transistor drain region and the transistor extension region are disposed on a same level, further comprising forming a transistor gate over that level.

14. The method of claim 13, wherein the transistor gate is disposed at least partially overlapping the transistor drain extension.

15. The method of claim 13, wherein the transistor gate is formed without overlapping the trenches.

16. The method of claim 15, wherein the trenches are filled with dielectric material before forming the transistor gate.

17. The method of claim 10, further comprising forming electrical contacts to each of the transistor source region and the transistor drain region.

18. The method of claim 17, wherein forming electrical contacts comprises forming a plurality of electrical contacts to each of the transistor source region and the transistor drain region.

19. The method of claim 18, wherein a transistor drain region is disposed at separated ends of the strips, wherein the electrical contacts contact ends of each of the strips.

20. The method of claim 10, wherein the transistor drain region extends across and connects each of the strips of substrate material.

21. The method of claim 10, wherein the transistor source region extends across and connects each of the strips of substrate material.

22. A method for fabricating a transistor, comprising:
- photolithographically defining a plurality of spaced-apart photoresist rows in a photoresist layer;
- deriving a mask pattern from the photoresist rows, the mask pattern comprising loops of mask material formed by elongated portions connected at ends of the loops, the elongated portions having a pitch two times or more a pitch of the photoresist rows;
- transferring the mask pattern to an underlying substrate, thereby defining a plurality of spaced apart rows in the substrate, wherein transferring the mask pattern to the underlying substrate comprises transferring a pattern formed by exposed portions of the loops to the substrate while a protective mask material overlies the ends of the loops;
- preventing transfer of a shape defined by the ends of the loops to the substrate while transferring the mask pattern to the underlying substrate;
- providing a transistor source region contiguous with one end of the rows in the substrate; and
- providing a transistor drain region contiguous with an other end of the rows in the substrate.

23. The method of claim 22, wherein deriving the mask pattern comprises:
- blanket depositing a spacer material on the spaced-apart photoresist rows;
- etching the spacer material to form spacers on sidewalls of the photoresist rows; and
- selectively removing the photoresist rows.

24. The method of claim 22, wherein the plurality of spaced apart rows have a row width and the rows are separated by a row separation width, wherein a ratio of row width to row separation is about 1:1 or more.

25. The method of claim 22, further comprising providing a gate overlying the substrate and disposed between the source and drain regions, wherein the spaced apart rows are disposed on one side of the substrate.

26. The method of claim 22, wherein the substrate comprises a N-type region overlying a P-type region, wherein transferring the mask pattern defines trenches extending through the N-type region into the P-type region.

27. The method of claim 26, wherein providing the transistor source region and providing the transistor drain region comprises performing a doping process to form the N-type region.

28. The method of claim 22, wherein the rows in the substrate extend substantially parallel to one another, each row in the substrate extending in a substantially straight line.

* * * * *

UNITED STATES PATENT AND TRADEMARK OFFICE
CERTIFICATE OF CORRECTION

PATENT NO. : 8,076,208 B2  Page 1 of 1
APPLICATION NO. : 12/167976
DATED : December 13, 2011
INVENTOR(S) : Mike Smith It is certified that error appears in the above-identified patent and that said Letters Patent is hereby corrected as shown below:

On the title page, item (57), under "Abstract", in column 2, line 4, delete "isolaton" and insert -- isolation --, therefor.

On the title page, item (57), under "Abstract", in column 2, line 4, delete "isolaton" and insert -- isolation --, therefor.

On the title page, item (57), under "Abstract", in column 2, line 14, delete "isolaton" and insert -- isolation --, therefor.

On the title page, item (57), under "Abstract", in column 2, line 17, delete "isolaton" and insert -- isolation --, therefor.

Signed and Sealed this
Twenty-first Day of February, 2012

David J. Kappos
*Director of the United States Patent and Trademark Office*